United States Patent [19]

Petroff et al.

[11] 3,997,368

[45] Dec. 14, 1976

[54] ELIMINATION OF STACKING FAULTS IN SILICON DEVICES: A GETTERING PROCESS

[75] Inventors: Pierre Marc Pétroff, Westfield; George Arthur Rozgonyi, Chatham, both of N.J.

[73] Assignee: Bell Telephone Laboratories, Incorporated, Murray Hill, N.J.

[22] Filed: June 24, 1975

[21] Appl. No.: 589,945

[52] U.S. Cl. .............................. 148/1.5; 148/175; 148/188

[51] Int. Cl.² ..................................... H01L 21/265

[58] Field of Search ............ 148/1.5, 187, 175, 188

[56] References Cited

UNITED STATES PATENTS

| | | | |
|---|---|---|---|
| 3,418,181 | 12/1968 | Robinson | 148/187 |
| 3,494,809 | 2/1970 | Ross | 148/187 X |
| 3,579,815 | 5/1971 | Gentry | 148/175 X |
| 3,701,696 | 10/1972 | Mets | 148/175 |
| 3,806,371 | 4/1974 | Barone | 148/1.5 |

OTHER PUBLICATIONS

Mets, "Poisoning & Gettering Effects in Si Junctions", J. Electrochem. Soc., vol. 112, pp. 420–425 (1965).
Pomerantz, "A Cause & Cure of Stacking Faults—etc." JAP, vol. 38, pp. 5020–5026 (1967).
Lawrence, "On Lattice Disorders—etc." Semiconductor Silicon, Haberecht, et al. Eds., pp. 569–609 (1969).
Lawrence, "Correlation of Si Material Characteristics—etc." Semiconductor Silicon, Huff, Ed., P. Electrochem Soc., pp. 17–34 (1973).

Seidel, et al., "Ion Implantation Damage Gettering—etc." Ion Implantation in Semiconductors—etc., Crowder, Ed. Plenum, pp. 305–315 (1973).
Rozgonyi, et al. "Elimination of Oxid. Induced Stacking Faults—etc." J. Electrochem. Soc., 84C, Abst. No. 172, Mar. 1975.
Barson, et al. "Gettering Technique", IBM Tech. Dis. Bull., vol. 15, No. 6, Nov. 1972, p. 1752.

*Primary Examiner*—L. Dewayne Rutledge
*Assistant Examiner*—J. M. Davis
*Attorney, Agent, or Firm*—Michael J. Urbano

[57] ABSTRACT

Described are procedures for fabricating silicon devices which prevent the formation and/or activation of stacking fault nucleation sites during high temperature processing steps, such as steam oxidation of silicon wafers. The procedures, which take place before such high temperature steps, include forming on the back surface of the wafer a stressed layer and then annealing the wafer for a time and at a temperature effective to cause the nucleation sites to diffuse to a localized region near to the back surface. Illustratively the stressed layer comprises silicon nitride or aluminum oxide. Enhanced gettering is achieved if, prior to forming the stressed layer, interfacial misfit dislocations are introduced into the back surface by, for example, diffusion of phosphorus therein. Following the gettering step(s) on the back surface, conventional procedures, such as growing epilayers and/or forming p-n junctions, are performed on the front surface of the wafer.

13 Claims, 29 Drawing Figures

CROSS SECTION OF TYPICAL SBC TRANSISTOR

1 μ

25 μ

# ELIMINATION OF STACKING FAULTS IN SILICON DEVICES: A GETTERING PROCESS

BACKGROUND OF THE INVENTION

This invention relates to stacking faults in silicon devices and, more particularly, to procedures for suppressing the formation of such stacking faults so that devices of more nearly uniform characteristics and improved performance can be fabricated.

The presence of stacking faults (SF) introduced during the processing of silicon devices is known to have a deleterious effect on device performance and may significantly reduce device yields in the fabrication of large scale integrated circuits. For example, localized microplasma breakdown of avalanche photodetectors, increased p-n junction leakage of various devices, and reduced storage time of CCDs have all been correlated with stacking fault defects. The stacking faults are generated during high temperature processing steps, most frequently during steam oxidation. The nucleation sites for these defects have been shown to be related to residual mechanical damage, local impurity precipitation and the so-called "swirl" defects. The latter two may be either process induced, i.e., caused by processing steps subsequent to crystal growth, or growth induced, i.e., native to the original cyrstal growth. Although adequate removal of surface damage is easily achieved with proper etching before polishing, it has not been a simple matter to remove process-induced or growth-induced defects from device wafers.

Numerous prior art studies of these defects in silicon wafers have produced the following results: (a) In the case of process-induced SF nucleation centers, small precipitates which form at or near the $SiO_2$—Si interface have been identified. In the case of SF nucleation centers introduced during the crystal growth, the oxidation induced SF distribution usually follows a swirl distribution for float zone silicon or a coring distribution for Czochralski silicon. It is probable that the precipitates and dislocation loops observed in the swirl pattern of dislocation free float zone silicon act as nucleation centers for the SF. (b) The oxidation induced SF have an extrinsic nature and grow by a climb mechanism from an interfacial dislocation presumably emitted by the precipitate. (c) In some instances impurities have been found to play an important role in promoting the formation of SF. A wafer surface orientation dependence on the appearance of SF has also been reported. In the case of HF treated, wet oxidized Si wafers, it has been found that {111} surfaces or surfaces with orientation 3° to 10° of {100} do not show SF after oxidation.

This apparent wealth of experimental results, however, has not yet produced a solution to the SF problem which keeps reappearing in Si device fabrication. A number of important questions remain unanswered: (a) the nature of the precipitates which act as nuclei to the SF formation, (b) the nature of the impurities and point defects involved in the precipitate formation and the growth of the SF, and (c) the nature of the extrinsic fault. The SF could be composed of an extra plane of oxygen atoms or extra plane of Si atoms.

Since the answers to these guestions require complex analytical techniques in many cases not yet available, we sought a solution to the SF problem by using gettering techniques prior to any high temperature processing step which tends to induce SF.

SUMMARY OF THE INVENTION

In the manufacture of a semiconductor device from a silicon wafer, before any high temperature processing steps are performed which might tend to generate SF in the silicon wafer, for example steam oxidation of one major surface (device side), lattice distortion is introduced in the opposite major surface (back surface) and then processing steps are performed directed toward the completion of the device, e.g., growing an epitaxial layer and/or diffusing or otherwise introducing doping impurities to form p-n junctions. Lattice distortion is introduced by forming a stressed layer on the back surface. Illustratively the stressed layer comprises silicon nitride or aluminum oxide. The layer is then annealed for a time and at a temperature effective to cause SF nucleation sites to diffuse to a localized region near to the back surface.

According to a feature of another embodiment of our invention, enhanced gettering is achieved if prior to forming the stressed layer, an array of misfit dislocations is deliberately introduced into the back surface by suitable diffusion of phosphorus, for example. This feature is particularly useful when swirl defects are present in as-received {100} wafers.

Preferably both the stressed layer and the phosphorus diffusion are utilized to perform gettering. In this case the stressed layer also serves a protective function in that it prevents outdiffusion of phosphorus from one wafer into another wafer in the same processing chamber.

These procedures have been found effective to suppress the formation of SF in numerous silicon devices. In particular, our technique is compatible with the fabrication of numerous silicon devices including, for example, bipolar devices (e.g., SBC transistors and p-n junction diodes) and MOS devices (e.g., CCDs and REPROMs). Thus, our invention contemplates suppression of SF in devices which incorporate an epi-layer as well as those which do not. In addition, our invention can be used to fabricate a single device from an entire wafer (a high power transistor, for instance) or a number of devices from a single wafer (by dicing the wafer into a plurality of chips each containing a separate device or integrated circuit, for example).

The gettering mechanism which effectively eliminates SF nucleation sites is not completely understood at this time. Our experiments using nitride layers suggest, however, that either stress in the layer, and/or its nonstoichiometry, may be possible sources of the driving forces of the gettering mechanism. The layer thickness as well as the annealing time and temperature, which are correlated to stress, determine the effectiveness of this gettering procedure. Preferably the nitride layer is between about 2,000 A and 4,000 A thick and is annealed in a suitable atmosphere for about 1 to 4 hours at a temperature of about 1,000° C to 1,200° C. With respect to the use of phosphorus diffusion prior to forming the stressed layer, the driving force for the generation of the dislocations is the misfit strain introduced into the silicon lattice. The depth and density of the dislocation array can be adjusted by varying the diffusion time and temperature, preferably in the range of about 1,050° C to 1,150° C for about 1 to 7 hours. Since the dislocations are interfacial in character, they lie parallel to the back surface and are confined to within a few microns thereof. The dislocations, which are line defects, act as sinks for a variety of point defects such as impurities and vacancies (potential SF nucleation sites).

It is important to note that the stressed layer and, if used, the array of misfit dislocations, are introduced in the as-received wafers before device processing is initiated and are intended initially as sinks for native defects which are incorporated during crystal growth or introduced inadvertently during wafer preparation and cleaning. Second, both are expected to continue to act as sinks for impurities introduced during subsequent high temperature device processing. The total effect of the gettering actions is the gross reduction or elimination of SF defects near active device regions with a resulting improvement in device properties (e.g., MOS storage time, p-n junction leakage and breakdown).

BRIEF DESCRIPTION OF THE DRAWING

These and other objects of our invention, together with its various features and advantages, can be more easily understood from the following more detailed description taken in conjunction with the accompanying drawing, in which:

FIGS. 5A–5D show the following:
  A. Si surface after removal of the $Si_3N_4$ film.
  B. Surface of the ungettered half of the wafer back side.
  C. Surface of the gettered half of the wafer front side.
  D. Surface of the ungettered half of wafer front side.

FIGS. 7A and 7B show the following:
  A. Surface of the gettered half of the wafer front side.
  B. Surface of the ungettered half of the wafer front side. Etch features are characteristic of stacking faults;

DETAILED DESCRIPTION

Figure 1:
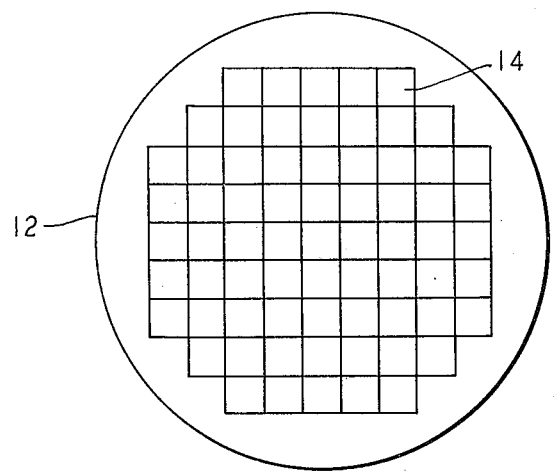
FIG. 1 shows a circular wafer on which the grid of squares depicts a plurality of devices or integrated circuits, for example, to be separated by dicing.

Integrated circuits are typically prepared using batch-type processing on a wafer 12 of silicon as shown in FIG. 1. Customarily each square 14 becomes an integrated transistor or transistor circuit. Of course, the square could represent MOS devices or circuits as well as bipolar ones. A single wafer typically two or three inches in diameter may have several hundred or more individual integrated circuits formed on it. Near the end of the process, these are cut or otherwise separated from the wafer into separate discrete units called chips. Alternatively, the entire wafer 12 may be used to form a single device such as a high power transistor. In either case, the presence of defects, such as stacking faults (SF), or dislocations (D), can adversely affect device performance and hence result in lower processing yields.

Figure 2:
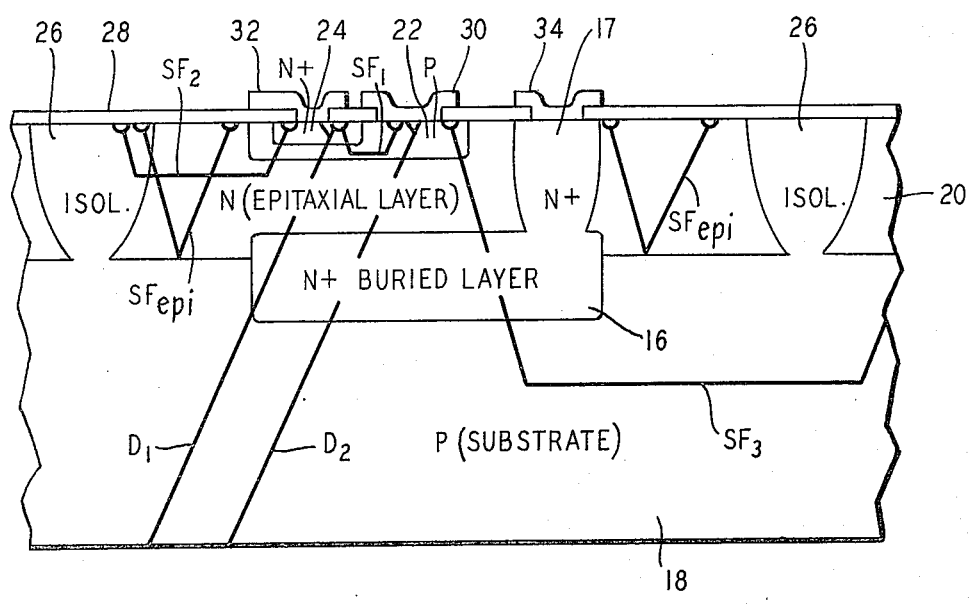
FIG. 2 is a cross-sectional view of a standard buried collector (SBC) transistor used to explain how SF can affect device performance.

By way of illustrating the effects of defects on device performance, consider that each square 14 of FIG. 1 is an integrated circuit including a standard buried collector (SBC) transistor of the NPN type shown in FIG. 2. The SBC transistor includes an $N^+$-buried layer 16 located at the interface between a P-substrate 18 and an N-epitaxial layer 20. The buried layer, usually formed by diffusion, serves to reduce collector resistance and to this end is connected to the collector contact 34 through $N^+$-zone 17. Subseqently, conventional diffusion is used to form a P-base 22 and $N^+$-emitter 24 over the buried layer 16. Vertical isolation is provided by the P-N junction between the substrate and N-epitaxial layer and by the $P-N^+$ junction between the substrate and buried layer. Lateral isolation, on the other hand, is provided by isolation zones 26 which may be formed either by a P-diffusion or by etching and filling with oxide. Openings formed in insulative layer 28 allow contacts, 30, 32 and 34 to be made to the base, emitter and collector, respectively.

The performance of the SBC transistor can be adversely affected by either dislocations or stacking faults which intersect P-N junctions and cause excessive leakage currents. Dislocations, which may be generated by thermal asymmetries (which cause bending) during processing, extend through the entire device from the front surface to the back. A dislocation may intersect both the emitter-base and collector-base junctions of the transistor (see D1) or merely one of the junctions (see D2). Generally, if no junction is intersected, then the dislocation may have no effect, or only a minimal effect, on device performance. And, if only one junction is intersected, as in D2, the effect is less severe than if more junctions are intersected, as in D1.

Stacking faults such as SF1, SF2 and SF3, on the other hand, may either be generated by bulk defects (vacancy/impurity complexes) or contamination of the front side of the substrate. If caused only by the latter, then the stacking faults are all of the same shape and depth, e.g., all SF1 or all SF2 but not a combination of both. If caused by bulk defects, the stacking faults may vary in both shape and depth. Lastly, stacking faults in the epi-layer (SFepi) are correlated with saucer pits (S-pits) at the substrate-epi interface. In {111} Si, high temperature oxidation generates either S-pits or SF, while in {100} Si SF are almost always generated.

We will now discuss the manner in which SF are suppressed so that devices of more uniform characteristics and improved performance can be manufactured. Unless otherwise stated, the details of the examples which follow are for illustrative purposes only and are not to be construed as limitations on the scope of the invention.

EXAMPLE I

This example describes the suppression of SF in silicon devices by means of a silicon nitride ($Si_3N_4$) film formed on the back surface of a silicon wafer.

$Si_3N_4$ films were deposited by low temperature 300° C d.c. sputtering or by chemical vapor deposition (CVD) at 800° C on the back side of Si wafers. The front side of each wafer was Syton polished and was used to study the SF. The wafer orientation was {111} or {111} and both Czochralski and float zone, dislocation free, high purity n-type silicon was used in these experiments. The wafer thicknesses ranged from about 330 to 430 $\mu$m and the $Si_3N_4$ film thicknesses deposited were typically several thousand Angstroms for both the sputtered and the CVD $Si_3N_4$ films. For effective gettering the thickness of the $Si_3N_4$ film is related to the wafer thickness and the value of stress in the layer. For wafers in the range of 300 to 500 $\mu$m thick, suitable nitride film thicknesses range from about 2,000 A to 4,000 A for a layer stress of about $1 \times 10^{10}$ dynes $cm^{-2}$.

The defect distribution in the wafers prior to and after these processing treatments was revealed by etching in a Secco etch solution which comprises $HF:K_2Cr_3O_7$ in a ratio of about 2:1. During etching, the wafers were mechanically rotated for ten minutes in an ultrasonically agitated bath to remove about 15 $\mu$m from each side of the wafer. Examination of the etch features was carried out by optical microscopy with Zeiss ultraphot microscope using Nomarski interference contrast optics. In some instances the defect nature and distribution were obtained by transmission electron microscopy (TEM) and X-ray topography (XRT).

Figure 3:
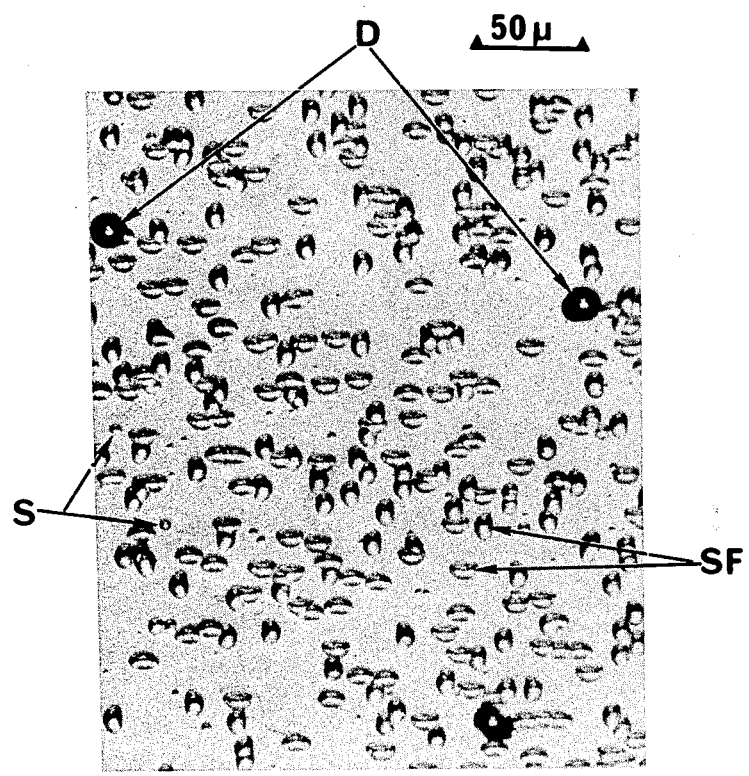
FIG. 3 is an optical photomicrograph of an etched (100) Si surface illustrating the etch pit morphology of dilocations, D, saucer pits, S, and stacking faults, SF.

Three types of etch pits are distinguished in oxidized {100} wafers as illustrated in FIG. 3. Emerging dislocations give rise to deep, black pits (D-pits) with a pointed bottom, see arrows D in FIG. 3. Unless a wafer has deliberately had misfit dislocations introduced, D-pits are found only near the perimeter of a wafer and are of the slip type, generally attributed to thermal asymmetries (which cause bending) during high temperature processing. Saucer pits, see arrows S, are shallow and flat bottomed and are generally associated with SF nucleation sites if they are distributed in a swirl pattern. Stacking faults, see arrows SF in FIG. 3, are always aligned along perpendicular <100> directions, horizontal or vertical in all our photomicrographs, and when fully developed usually have a larva-like appearance.

To evaluate the gettering process on the same wafer only one-half of the back surface of each wafer was covered with the $Si_3N_4$ film. After $Si_3N_4$ deposition and standard integrated circuit cleaning, the wafers were annealed in $N_2$ + 1% $O_2$ or in Ar atmosphere. The annealing temperatures were varied from about 1,000° C to 1,200° C and annealing times ranged from about 1 to 4 hours.

Some of the wafers which were annealed as described above were cleaned and steam oxidized at 1,050° C for 35 minutes to grow 4,000 A of $SiO_2$. The $Si_3N_4$ layer was left on the back of the wafers during the oxide deposition. For some wafers the $Si_3N_4$ layer was removed prior to the oxide deposition. After the Secco etching treatment described above the defect nature and distribution in these wafers was then inspected by optical microscopy and TEM.

Chemical impurities in the starting material and in the wafers subsequent to the $Si_3N_4$ deposition, annealing and oxidation steps were measured by neutron activation analysis. In addition, several impurity profile distributions through the wafer thickness were obtained after repeated thinning of the gettered wafers. The wafers were thinned by mechanical lapping. A careful rinse in a jet of standard nonpreferential Si etch solution followed the lapping operation to completely remove small particulates left on the sample by the lapping operation. A final rinse in deionized water preceded the neutron activation analysis. The relative amount of material removed during the thinning operation was obtained from weight measurements of the samples with a microbalance.

The effectiveness of this pregettering method in producing lower p-n junction leakage and high device yields was tested on two types of structures. First, leakage currents in p-n junction devices which were part of the reprogrammable read often memory (REPROM) structure test pattern were measured on wafers which had been pregettered with our $Si_3N_4$ process prior to the first oxidation. These leakage measurements were compared to the leakage currents of the same devices in monitor wafers which were not pregettered. Both pregettered and ungettered wafers were processed simultaneously. Twelve wafers, each containing 100 test devices, were measured for leakage at 25 volts with an automatic prober.

The second type of structure used to test the effectiveness of the pregettering process consisted of 111 silicon wafers which contained an Sb diffused buried collector pattern beneath a Si epitaxial layer. The processing treatment preceded the epitaxial deposition which includes a steam oxide step. Prior work of others showed that the latter step leads to the formation of defect centers, i.e., shallow saucer or S-pits at the surface of the etched wafers after Secco etching. These centers in turn have been correlated with the occurrence of SF tetrahedra which appear during the epitaxial layer growth. Wafers which were subjected to our $Si_3N_4$ pregettering treatment as well as ungettered monitor wafers were processed simultaneously. Secco etching and optical microscopy were used after the various processing steps to confirm the effectiveness of the preoxidation gettering for both S-pits and epitaxial SF.

Figure 4:
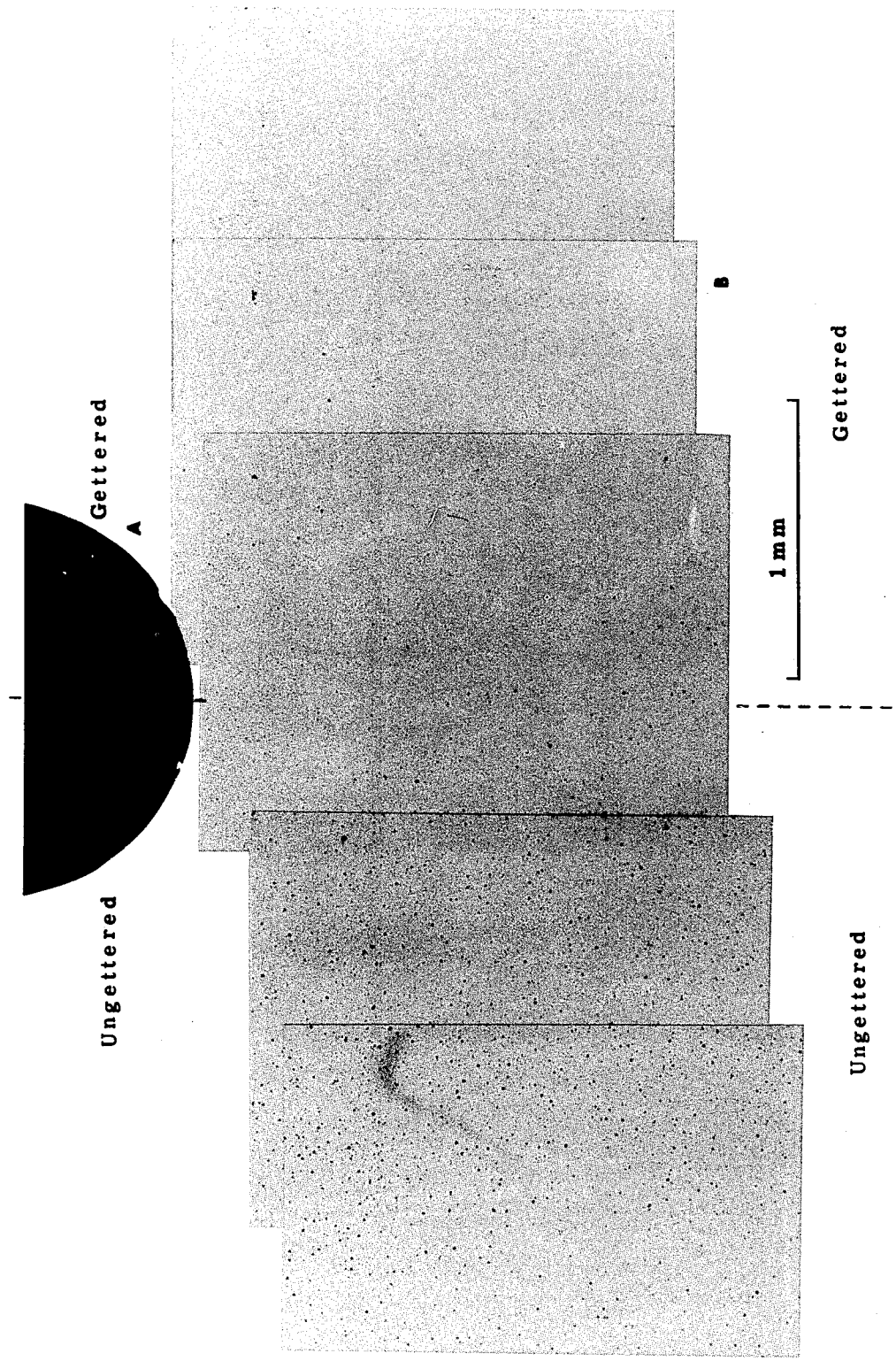
FIG. 4A is a photomacrograph of the front side of a semicircular Si wafer which was annealed in $N_2 + 1\%$ $O_2$ for 1 hr. at 1,000° C. Prior to annealing, half of the back surface was coated with 4,000 A of sputtered $Si_3N_4$. The differences between the gettered and ungettered part of the wafer have been revealed by an 8 min. Secco etching treatment.
FIG. 4B is an optical micrograph of the front side of a gettered wafer showing the boundary between the gettered and ungettered parts of the wafer. The etch features in the ungettered part have been revealed by an 8 min. Secco etching treatment.
Figure 5:
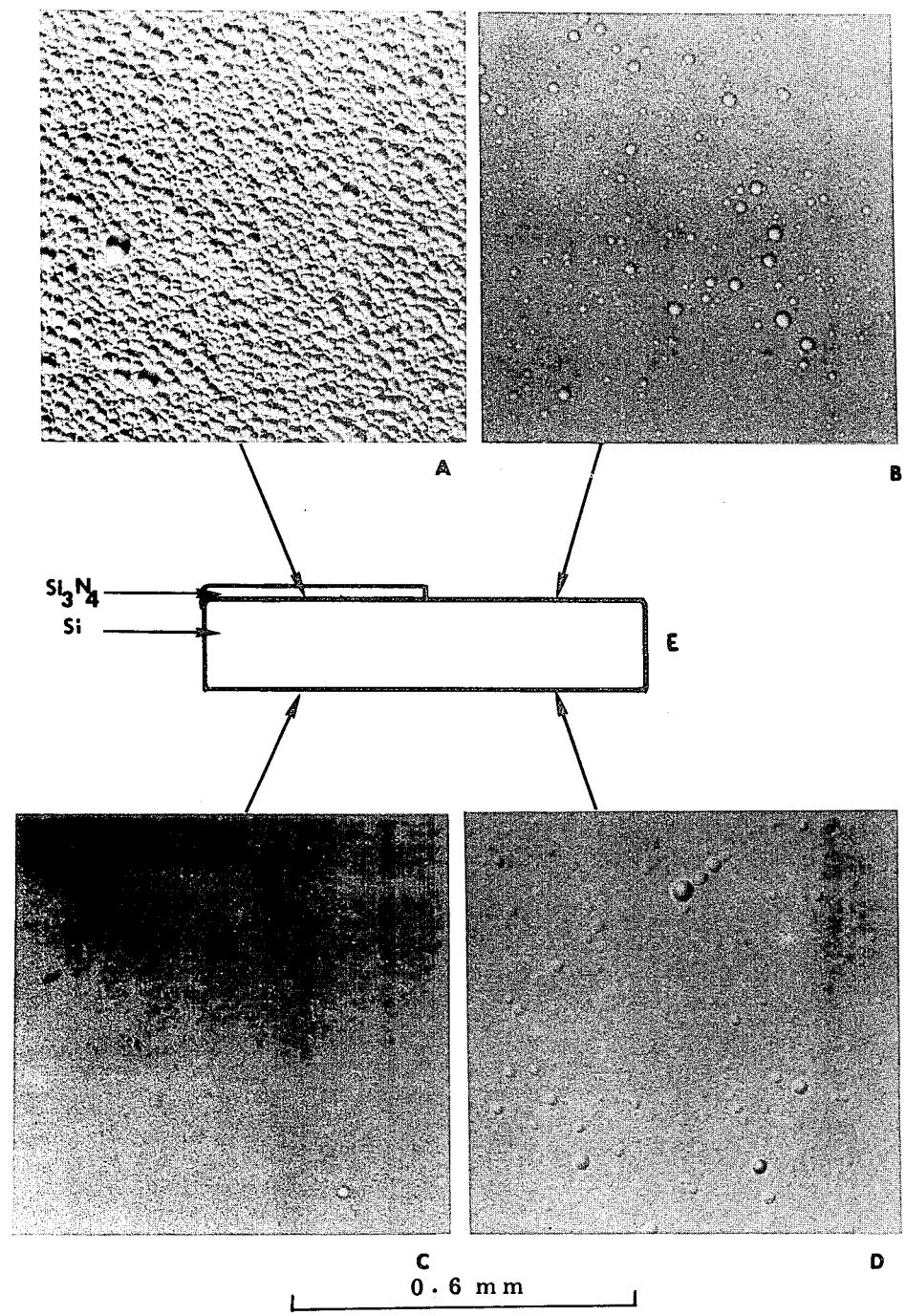
FIGS. 5A–5D show the etch features of a Si wafer after annealing at 1,000° C in $N_2 + 1\%$ $O_2$ for 1 hr. Prior to annealing, half of the back surface was coated with 4,000 A of $Si_3N_4$ as shown schematically in FIG. 5E. With a magnification of 600x.

The difference in the defect structures between the gettered and ungettered parts of an unoxidized Si wafer are shown in the photomacrograph in FIG. 4A and in the optical micrograph in FIG. 4B. These micrographs show the front side of a wafer which was gettered on only half of its back side. The etch features associated with defects in the silicon are clearly visible only on the ungettered part of the wafer in FIG. 4B. In the higher magnification micrographs in FIGS. 5B and 5D these etch features appear as round pits with a density between 1 to $4 \times 10^6/cm^2$ in the ungettered part of the wafer, while on the front surface of the gettered half of the wafer the pit density ranges from zero to $10/cm^2$ as shown in FIG. 5C. The CVD $Si_3N_4$ and the sputtered $Si_3N_4$ gave identical results for a 1 hour anneal at 1,050° C. However, it should also be noted that some float zone dislocation free silicon characterized by a heavy swirl pattern (which is known from previous studies to be composed of precipitates and vacancy and interstitial type loops) did not exhibit the same behavior upon gettering. In this material the $Si_3N_4$ layer did not result in the elimination of the swirl defects. These defects are more resistant to gettering than those previously observed to have been eliminated by the $Si_3N_4$ gettering process. Therefore, as described in Examples II and III, when such swirl defects are present, nitride gettering should be combined with misfit dislocation gettering in order to suppress the formation of SF from this kind of defect.

Figure 6:
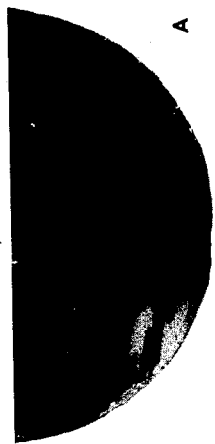
FIG. 6A is a photomacrograph of the front side of a semicircular Si wafer after annealing (in $N_2 + 1\%$ $O_2$ for 1 hr. at 1,050° C) and oxidized (wet oxide at 1,050° C, 2 hrs.). Prior to annealing, half of the back surface was coated with 4,000 A of sputtered $Si_3N_4$. The differences between the gettered and ungettered part of the wafer have been revealed by an 8 min. Secco etching treatment.
FIG. 6B is an optical micrograph of the front side of the same wafer showing the boundary between the gettered and ungettered parts of the wafer.
Figure 6:
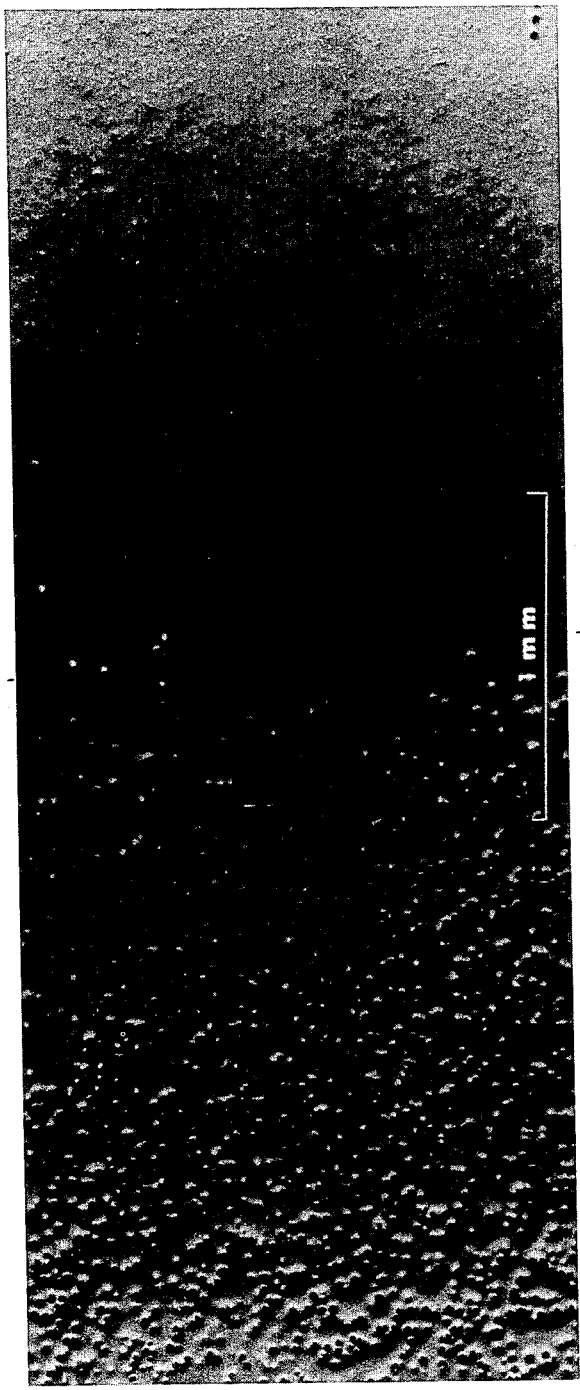
Figure 7:
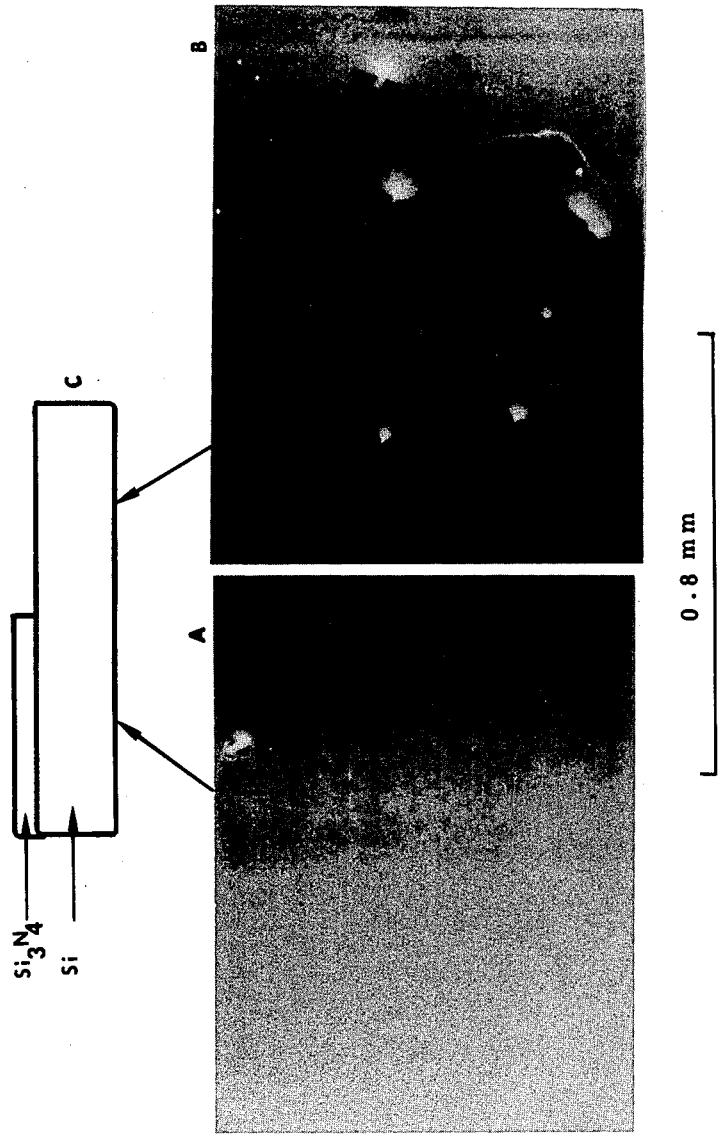
FIG. 7A and 7B show the etch features of a Si wafer after annealing and oxidation (annealing at 1,050° C in $N_2 + 1\%$ $O_2$ for 1 hr., oxidation at 1,050° C for 35 min. wet oxide). As depicted schematically in FIG. 7C, half of the back surface was coated with 4,000 A of sputtered $Si_3N_4$ prior to annealing and oxide deposition. Prior to etching, the oxide was removed. With a magnification of 800x
Figure 8:
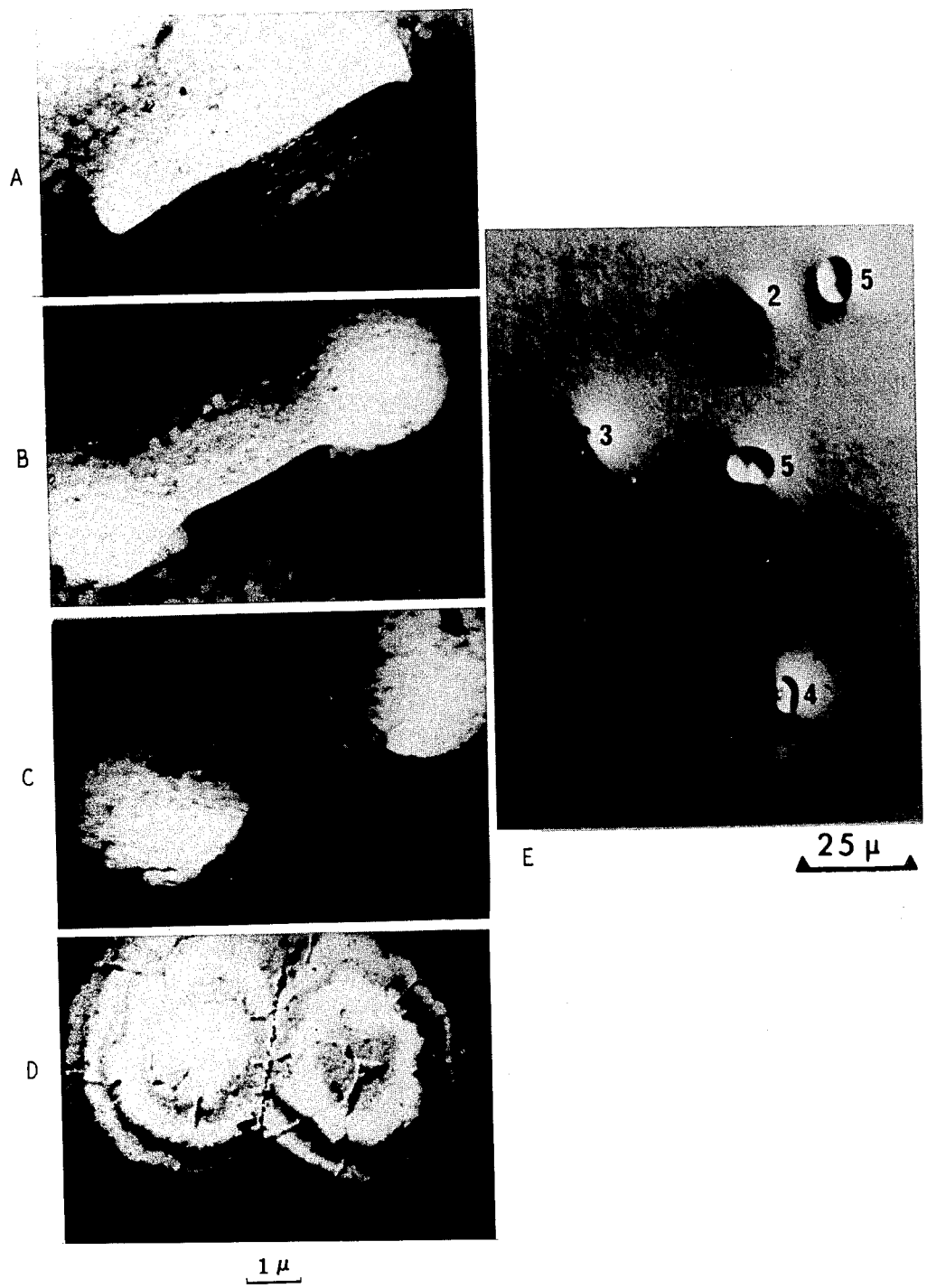
FIGS. 8A–8D are transmission electron micrographs of different etching stages of oxidation induced SF with magnification of 10,000x.
FIG. 8E is an optical micrograph of etch features due to oxidation-induced SF. Etch pit 1 corresponds to an SF below the Si surface. Etch pits 2 to 5 respectively correspond to the various etching stages of the SF shown in the micrographs FIGS. 8A to 8D.
Figure 9:
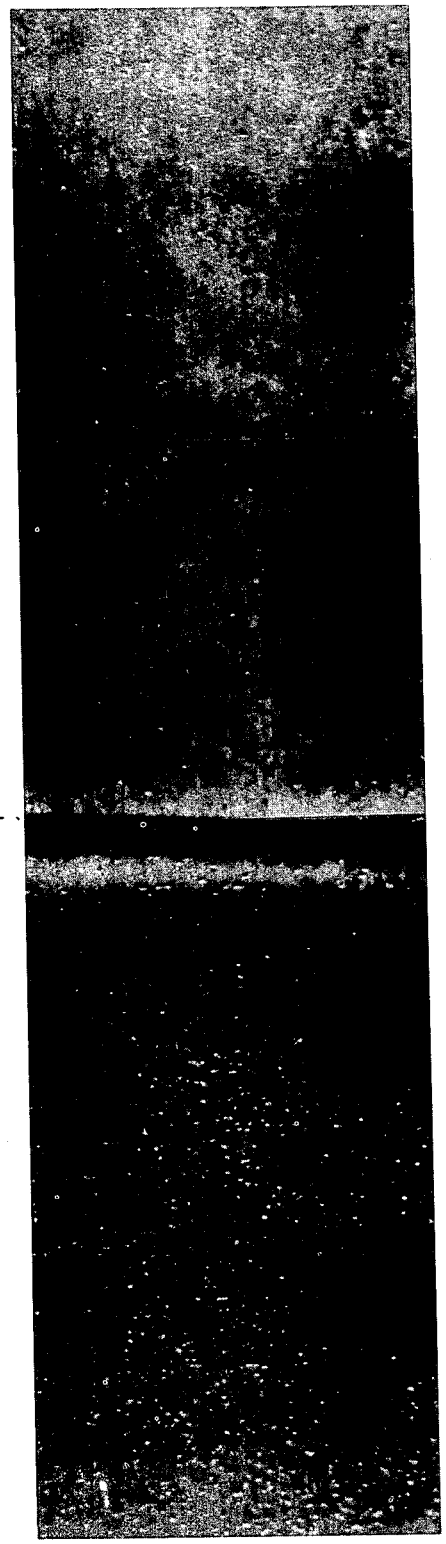
FIG. 9 is a transmission X-ray topograph of a Si wafer after preoxidation gettering (wet oxide deposited at 1,050° C for 2 hrs.). The right part of the micrograph, which corresponds to the half of the wafer coated with $Si_3N_4$ on the back surface, is essentially free of defects. The left part of the micrograph corresponds to that half of the wafer not coated with $Si_3N_4$. A high density of SF associated with black and white spots is observed in this half of the wafer. The transmission X-ray image shows that the entire volume of wafer below the gettering layer is free of SF.

The wafers which were subjected to preoxidation gettering exhibited, after steam oxidation ($\simeq 3,000$ A of $SiO_2$), a very distinct defect distribution from that in ungettered wafers. FIGS. 6A and 6B illustrate, for a pregettered and steam oxidized wafer, the absence of etch features characteristic of SF on the front side of the wafer opposite the $Si_3N_4$ film. Higher magnification micrographs of the front side of an oxidized wafer which was pregettered are shown in FIGS. 7A and 7B. The etch features in the ungettered part of this wafer (FIG. 7B) have indeed been correlated with the different etching stages of SF as shown in the transmission electron micrographs in FIG. 8. The X-ray topograph shown in FIG. 9 illustrates the effectiveness of our pregettering process in preventing SF formation. For those wafers which were pregettered the suppression of the SF was equally effective when the $Si_3N_4$ layer was removed prior to the oxide deposition. However, as discussed hereinafter, there are two reasons for leaving the $Si_3N_4$ layer on the back surface during subsequent processing: it continues to act as a getter for process-induced defects, and when combined with misfit dislocation gettering, it serves a protective function to prevent outdiffusion.

The importance of metallic impurities in promoting the SF formation during steam oxidation is well known. Since our $Si_3N_4$ pregettering process has proven to see effective in suppressing SF formation, its role as a metallic impurity gettering process was also checked by neutron activation analysis. The results of neutron activation analysis on fourteen wafers taken at various stages of the processing are summarized in Table I along with the chemical analysis of control wafers.

TABLE 1

| Sample No. | Au (atoms/cm³) | Cu (atoms/cm³) | Wafer Treatment |
|---|---|---|---|
| 1 | $1.4 \times 10^{11}$ | $3.9 \times 10^{13}$ | Cleaned. |
| 2 | $1 \times 10^{11}$ | $1.3 \times 10^{13}$ | |
| 3 | $1.3 \times 10^{13}$ | $1.3 \times 10^{14}$ | $Si_3N_4$ sputter |
| 4 | $5.2 \times 10^{12}$ | $1.6 \times 10^{14}$ | deposited. |
| 5 | $2.2 \times 10^{12}$ | $1 \times 10^{13}$ | $Si_3N_4$ sputter deposited. Removed. |
| 6 | $3.8 \times 10^{12}$ | $2.2 \times 10^{14}$ | Same treatment as No. 5 then sample annealed 2 hrs., 1000° C in $N_2 + 1\% O_2$. |
| 7 | $5 \times 10^{11}$ | $9.8 \times 10^{13}$ | Cleaned. Annealed 2 hrs., 1100° in $N_2 + 1\% O_2$. |
| 8 | $4 \times 10^{12}$ | $2 \times 10^{14}$ | $Si_3N_4$ sputter deposited; removed. Sample annealed 2 hrs., 1100° C in $N_2 + 1\% O_2$. |
| 9 | $5 \times 10^{12}$ | $2.2 \times 10^{14}$ | $Si_3N_4$ sputter deposited. Sample annealed 2 hrs., 1100° C in $N_2 + 1\% O_2$. |
| 10 | $4 \times 10^{12}$ | $1.7 \times 10^{13}$ | Same sample as No. 9; $Si_3N_4$ removed. |
| 11 | $2.3 \times 10^{13}$ | $3.4 \times 10^{14}$ | $Si_3N_4$ sputter |
| 12 | $1 \times 10^{13}$ | $2.7 \times 10^{14}$ | deposited; annealed 1000° C 1 hr. in $N_2 + 1\% O_2$ |
| 13 | $8.5 \times 10^{12}$ | $4.2 \times 10^{13}$ | Same sample as No. 11 and No. 12 |
| 14 | $6.3 \times 10^{12}$ | $3 \times 10^{13}$ | respectively, but $Si_3N_4$ was removed |

These analyses indicated that two sources of metallic impurities (namely, Cu and Au) were introduced during the wafer processing. A comparison of the Au and Cu concentrations in samples 1,2 and 3,4 indicated that the $Si_3N_4$ deposited by RF sputtering was contaminated with Au and Cu. The origin of these metallic elements was traced to the lining of the anode in the sputtering system. Both Au and Cu are very fast diffusing elements in Si at temperatures greater than 1,000° C where the sputtered $Si_3N_4$ is expected to behave as a Cu and Au contamination source during the pregettering annealing step. A second source of contamination is the annealing oven as shown by comparing the Au and Cu concentrations in samples 1,2,5 and 6,7 and 8. Both these contamination sources increase the Cu and Au content in the wafers by roughly an order of magnitude. After the pregettering annealing step, the measurements on samples 9,11,12 and 10,13,14 indicated that the $Si_3N_4$ retained and trapped the Cu and Au atoms and in effect acted as a gettering medium for both of these elements. The concentration of Cu in the pregettered wafers was essentially that found in clean uncontaminated wafers (compare the measurements on samples 1,2 and 9,13 and 14).

Application of our $Si_3N_4$ gettering process to device processing revealed that the effectiveness of this process on {100} Si wafers depends, in part, on the origin of the SF. Thus, we have found that there are two classes of oxidation-induced SF: surface or contamination induced, and bulk or native defect induced. For {100} wafers which would normally form surface SF upon oxidation, our $Si_3N_4$ pregettering process produced p-n junction devices which were virtually free of SF.

Measurements were made on test chips for REPROM devices. A 10 × 10 array of junctions was formed by diffusion of phosphorus into the front side of a boron-doped Si wafer to a depth of about 2.5 $\mu$m. These junctions had a normal breakdown voltage of about 29 volts and were tested at 25 volts. The p-n junction leakage currents were lower by 2 to 3 orders of magnitude; e.g., on sample G25 less than $10 \times 10^{-12}$ amps for most gettered devices compared to greater than $1 \times 10^{-9}$ amps for most ungettered devices. Other wafers which were $Si_3N_4$ gettered exhibited a bulk distribution of SF, sometimes in the so-called "swirl" pattern. Devices formed on these wafers (e.g., sample G22) had leakage currents which varied from as low as $10 \times 10^{-12}$ amps, in regions removed from the bulk SF, to as high as $1 \times 10^{-6}$ amps where SF were present, e.g., inside a swirl pattern. Once again, where such a swirl pattern exists, nitride gettering should be combined with misfit dislocation gettering to be described in Examples II and III.

Our $Si_3N_4$ preoxidation gettering process was also applied to the processing of bipolar epitaxial devices. After a Si epitaxial layer has been deposited on Si wafers which contained a pattern of Sb diffused or ion implanted regions, SF tetrahedrons have been often found. These SF tetrahedrons have been associated with nucleation centers which appear as S-pits upon Secco etching of the wafers prior to the epitaxial layer deposition. Our $Si_3N_4$ preoxidation gettering process applied prior to the first oxidation of the wafers was found to be virtually completely effective in suppressing these nucleation centers.

Based on the foregoing experiments it appears that our $Si_3N_4$ process is always effective in eliminating the contamination-induced SF for both {100} and {111} wafers and possible for native defects in {111} wafers. However, for native defects in {100} material a more severe preoxidation gettering, i.e., introduction of misfit dislocations discussed in Examples II and III, should be used in conjunction with the $Si_3N_4$ gettering to annihilate or deactivate these centers before oxidation.

EXAMPLE II

This example describes the suppression of SF in silicon devices by means of an array of misfit dislocations (MD) formed on the back surface of a silicon wafer by diffusion of phosphorus therein.

The gettering results described below were obtained on n-type {100} oriented dislocation-free Si wafers with a nominal resistivity of 5 $\Omega$cm. The wafers, which were purchased from the Monsanto and Wacker Corporations, were received with a Syton polished front side and chemically etched back side. The Monsanto wafers were from Czochralski ingots while the Wacker were float zone.

Because of wafer to wafer variations within a given batch, we processed each wafer so that only half of the back side was gettered before the entire wafer was oxidized. In this way a control was built into each sample. The procedure was as follows. A thick (1.2 to 1.5 $\mu$m) masking silicon oxide layer was deposited at 480° C on the front and then the backside of each wafer. A low temperature silane process was chosen to insure that no SF were generated. Conventional photolithography was used to strip the oxide from half of the backside while a uniform oxide coating was retained on the front. A phosphorus doped oxide was then formed on the unmasked half of the wafer using a well known $POCl_3$ process with an oxygen flow rate of 110 cc/min. Diffusion took place from the oxide into the wafer while the phosphorus doped oxide was being formed at temperatures from about 1,050° C to 1,150° C for times of about 1 to 7 hours. Within this temperature range a dense array of misfit dislocations was introduced to a depth of 2 $\mu$m or more below the phosphorus diffused surface. After stripping of the phosphorus doped oxide and silicon masking oxide, those wafers which were to be evaluated for SF were then oxidized in steam at 1,050° C for 110 min. to grow about 7,500 A of $SiO_2$. Without gettering, this oxidation step typically generates SF in {100} wafers.

The various etch pits were delineated using the Secco etch previously described in Example I.

Figure 10:
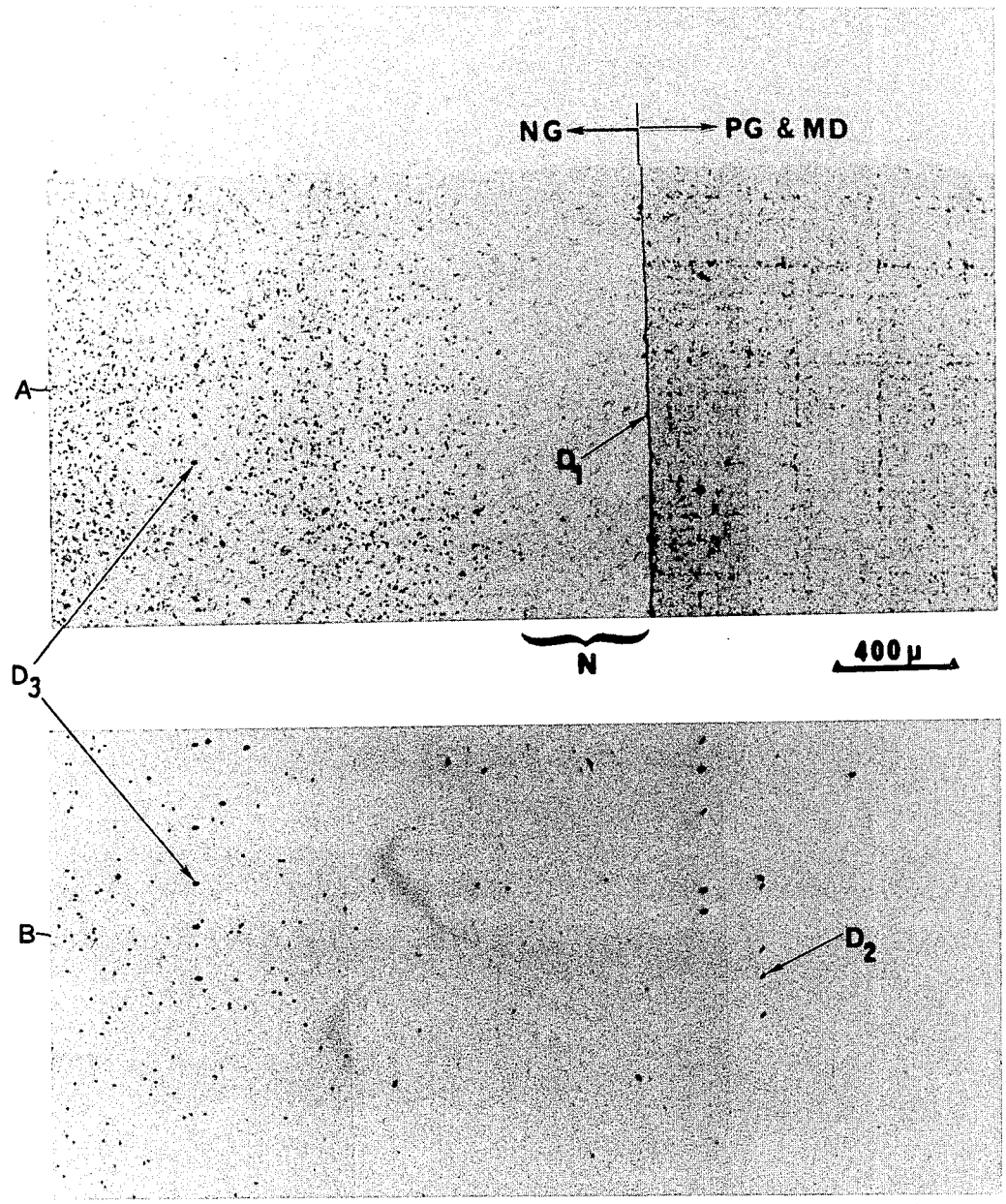
FIGS. 10A and 10B are micrographs showing the back (A) and front (B) etched surfaces of an oxidized Czochralski Si wafer half of whose back surface was phosphorus gettered (PG) to produce misfit dislocations (MD) while the other half and the front were not gettered (NG). The region N was denuded of SF.
Figure 11:
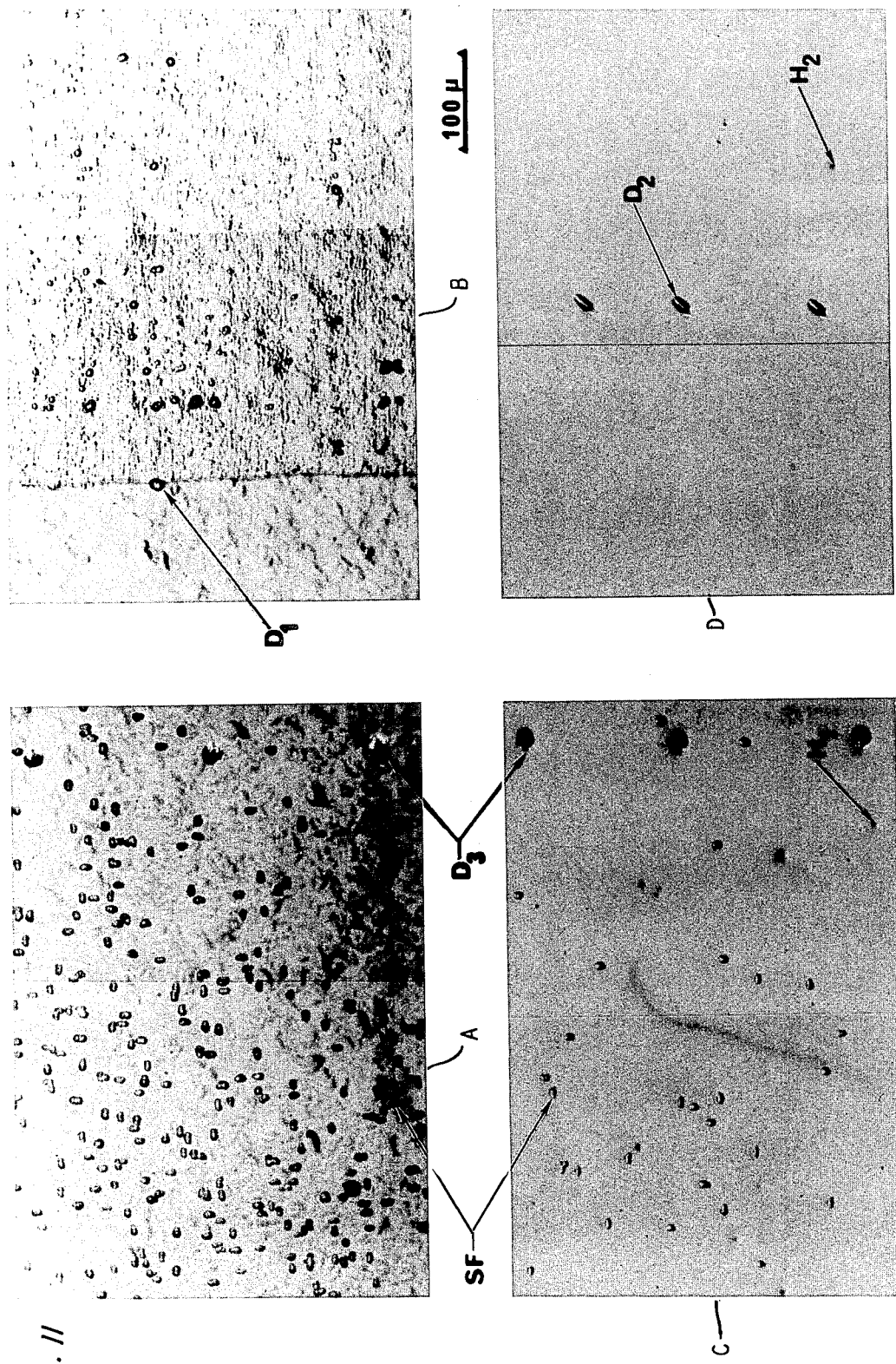
FIGS. 11A to 11D are higher magnification micrographs of those regions of FIG. 10 surrounding the slip dislocations $D_1$, $D_2$ and $D_3$. H is unidentified hillock defects.

The photomicrograph of FIG. 10A shows the boundary between the phosphorus gettered (PG) — misfit dislocation (MD) half and the nongettered (NG) half of the back side of a wafer after oxidation and Secco etching. The front side of the same wafer, which is shown in FIG. 10B, will be discussed below. Enlarged views of the regions surrounding the slip dislocations $D_3$ and $D_1$ are shown in FIGS. 11A and 11B. Since the lattice contraction in the PG half of the sample, which was treated for 1 hr. at 1,150° C, exceeded the threshold strain for generation of misfit dislocations, the trace of a cross grid of misfit dislocation is evident to the right of $D_1$, which is right on the PG/NG boundary line. Only a trace of the misfit dislocation array remains since the removal of 15 $\mu$m of silicon during the Secco etch has also removed most of the interfacial MD network from the sample. It has been found that no SF etch pits exist on that half of the wafer which was gettered, see FIG. 11B; whereas, several millimeters to the left of the PG/NG boundary the SF pit density was about $10^5$ cm$^{-2}$, see FIG. 11A. We conclude that our phosphorus diffusion — misfit dislocation process provides a very effective gettering action for those nucleation sites which otherwise would have promoted the formation of SF during oxidation.

The range of misfit dislocation gettering action is believed to be at least as large as the region N in FIG. 10A, which is denuded of all SF pits for a distance of $\geq$ 400 $\mu$m from the PG/NG boundary. Since the wafer thicknesses were about 300 $\mu$m for Monsanto and about 450 $\mu$m for Wacker material, SF gettering effects were also expected on the front side of the phosphorus treated wafers. This conclusion was checked as follows. The same D-pits were located on the front of the wafer under discussion, see arrow $D_3$ in FIG. 10B, in order to accurately align the PG/NG boundary. Note FIGS. 10A and 10B are mirror imaged about a horizontal axis with $D_3$, the third D-pit in a row of five. It was necessary to use the slip type D-pits for alignment because the misfit dislocations are truly interfacial in character and are confined to the back side of the wafer. Higher magnification photos of front surface regions around the dislocations $D_3$ and $D_2$ are presented in FIGS. 11C and 11D. The density of SF pits in the vicinity of $D_2$ is zero and is representative of the entire volume of the wafer below the misfit dislocation array. This volume has been further checked using transmission X-ray topography to confirm that SF are only present in the NG half of the wafer. On the gettered half, the higher density of SF in the back of the wafer, compare FIG. 11A (back) with FIG. 11C (front), appeared to be related to a local difference in contamination of the back of the wafer.

In addition to the pits, there are also etch hillocks observed, see arrows $H_1$ and $H_2$ in FIGS. 11C and 11D, which may also be associated with a microdefect, perhaps a small dislocation loop, for example. Further etching transforms the hillocks into shallow pits which are similar, but not identical to the S-pits. The hillocks are not observed using X-ray topography. Although there is a large reduction in the hillock density across the PG/NG boundary, it is nowhere near the $10^4$ to $10^5$ cm$^{-2}$ difference observed with the SF pits. However, samples which have been POCl$_3$ treated for 4 and 7 hours do show a further reduction in hillock density indicating that the gettering action, although slower, is also effective for the hillock defects. Results on a 4 hour PG sample before oxidation are discussed below.

Prior to oxidation the gettering action was evident for both S-pits and hillocks. This gettering is illustrated in FIG. 12A, which shows the Secco etched PG/NG boundary of the polished side of a Wacker float zone wafer which was phosphorus getterd on half of the back side for four hours at 1,150° C. The S-pit and hillock densities are both about $10^5$ cm$^{-2}$ in the NG region (see the arrows S and H in FIG. 12B, which is an enlarged view of the area marked (b) in FIG. 12A). On the front surface of the wafer directly opposite the PG treated back side, see FIG. 12C, no hillocks were observed at all and the S-pit density was reduced to about $5 \times 10^3$ cm$^{-2}$. The ability to eliminate the hillocks completely varied from sample to sample but was always more effective for gettering times longer than 1 hour.

Because of the well-documented differences in the oxygen content of float zone and Czochralski material and the possibility that oxygen plays a role in the formation of SF nuclei, a group of five float zone and five Czochralski wafers were gettered simultaneously. However, it was found that the variations in pit density, and other factors such as the occurrence of a swirl pattern, varied just as much within the separate groups of five as they did from group to group. However, we consistently observed in the large batch studies that on the gettered half of any wafer SF, S-pits and hillocks were either eliminated or reduced in number by several orders of magnitude. It therefore appears that the oxygen cencentration is not the predominant factor in the gettering of nucleation sites. This does not mean, however, that oxygen is not important when the SF are actually generated.

The experiments and etch pit data presented above demonstrate the interaction between a phosphorus getteringmisfit dislocation procedure and the nuclei responsible for oxidation-induced stacking faults. Those samples subjected to a phosphorus diffusion gettering treatment which did not introduce misfit dislocations (T less than about 1,050° C) did form stacking faults during oxidation. As a guide to help identify those defects and processes related to the nucleation of SF, we have provided FIG. 13.

Figure 13:
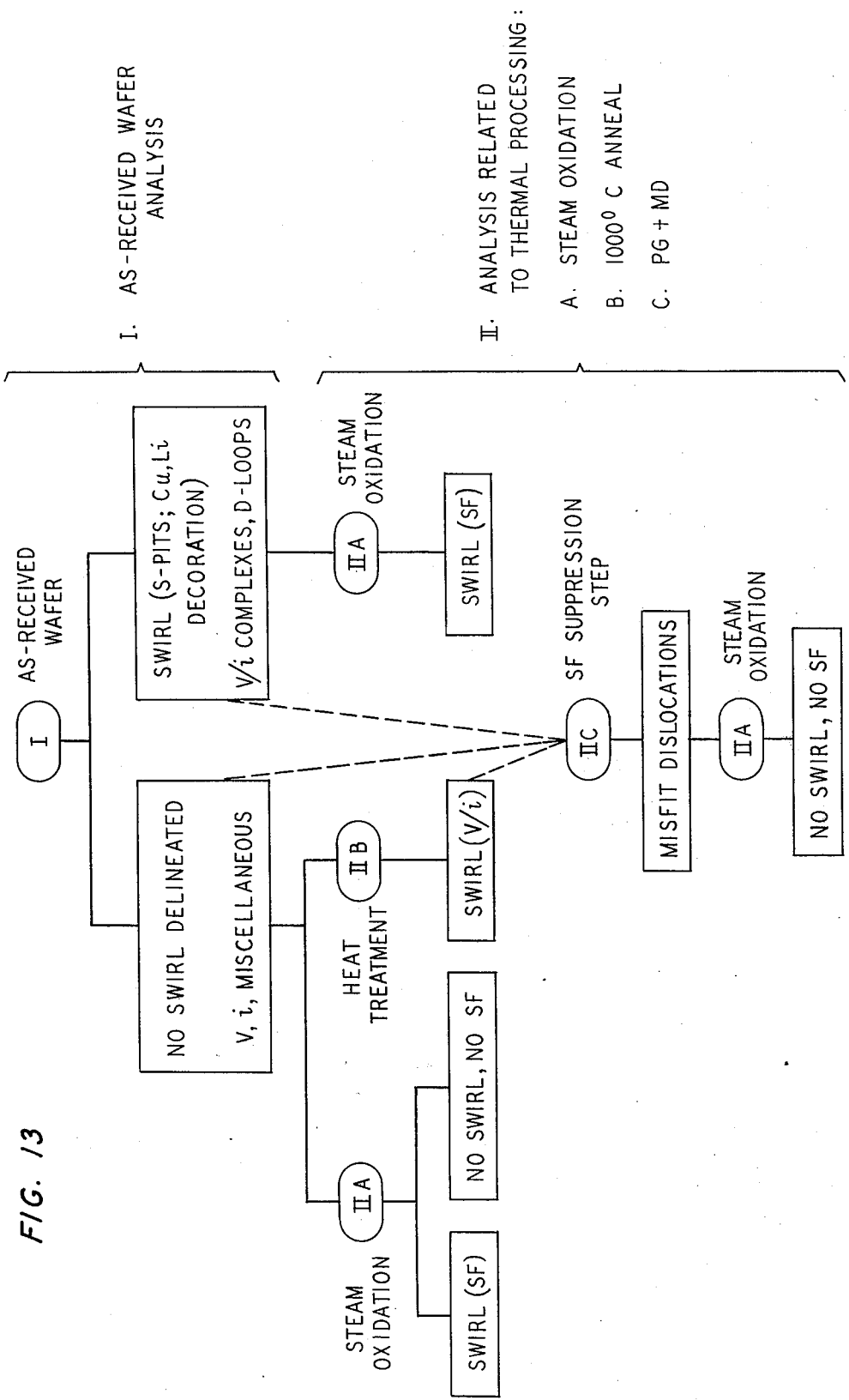
FIG. 13 is a flow diagram outlining the interrelations between swirl, native defects, process-induced defects and the suppression of oxidation induced SF. V and i represent vacancy and impurity, while SF and S correspond to stacking fault and saucer type defects.

It is known that interactions exist between grown-in and process-induced microdefects, whose macroscopic distribution is in the form of a swirl pattern, can be traced back to variations in the microscopic growth rate of the original crystal. FIG. 13 identified two groups of native defects according to whether or not a swirl pattern can be delineated by etching or X-ray topography of Cu or Li decorated samples. The swirl of S-pits in as-received wafers, stage I of FIG. 13, is attributed to a vacancy/impurity (V/i) complex, or to collapsed vacancy or interstitial clusters in the form of dislocation loops. If no swirl is delineated we still assume that isolated point defects are distributed in the crystal in a nonhomogeneous fashion. This assumption is based on the observation that swirl defects can be formed by a suitable heat treatment of swirl-free wafers, see process IIB in FIG. 13. Also, a swirl distribution of SF is observed after steam oxidation, process IIA of FIG. 13, even if no stage I swirl is delineated by etching.

Figure 12:
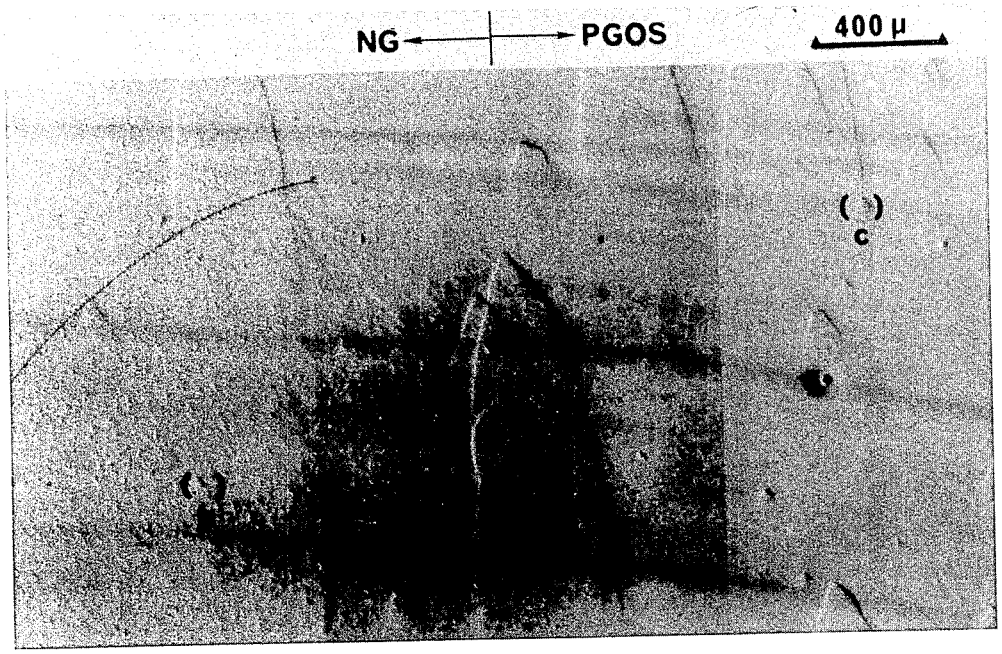
FIGS. 12A to 12C are micrographs showing the etched front surface of an unoxidized float zone wafer which was phosphorus gettered on half of the other side (PGOS). Arrows S and H are saucer pits and hillocks, respectively.
Figure 12:
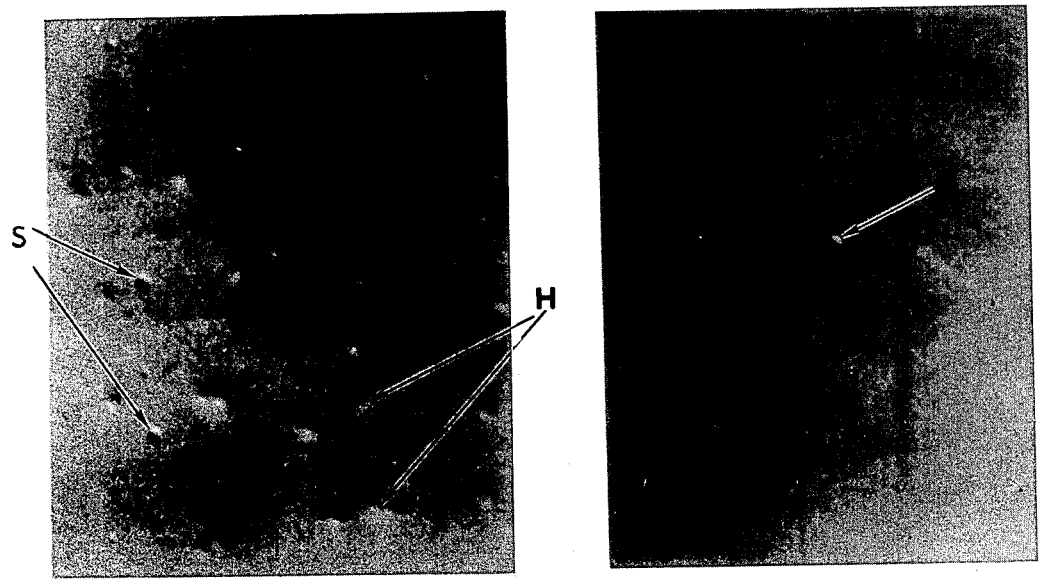

It is well established that metallic impurities introduced during stage II processing can become associated with stage I defects to form SF during oxidation or epitaxial growth. This type of process-induced defect is most certainly gettered by the misfit dislocations and/or phosphorus diffusion treatment itself. Process IIC in FIG. 13 illustrates how swirl and SF can be suppressed in as-received material and, we would expect, in any material which has not previously nucleated SF during processing, e.g., process IIB. However, since SF can be formed under very clean oxidizing conditions, the question arises as to whether our gettering procedure is also effective in eliminating stage I defects, e.g., vacancies, copper or small dislocation loops. The complete suppression of SF in the various material supplied to us indicates that native defect gettering may, in fact, be taking place. In addition, the elimination of the etch hillocks and large reduction in S-pit density discussed in relation to FIG. 12 is interrupted as a dissolution of SF nuclei. Finally, besides the dissolution or deactivation of native defects, the capture of process-induced SF nuclei by the misfit dislocation array can not be overstated because of the many oxidations and high temperature treatments required in silicon integrated circuit fabrication.

From a device standpoint, measurements were made on REPROM test chips of the same type described in Example I. Of the 10 × 10 array half were gettered by phosphorus diffusion-misfit dislocations on half of the back surface and half were ungettered. In the ungettered half of a typical sample designated C-1, the leakage currents were about $1 \times 10^{-6}$ amp or greater, whereas in the gettered half the leakage currents were three orders of magnitude lower, $1 \times 10^{-9}$ amp or less.

Although the foregoing experiments were performed using phosphorus diffusion to form the array of misfit dislocations, it is apparent to one skilled in the art that the MD can be generated by diffusion of other elements, notably boron.

EXAMPLE III

This example describes the suppression of SF in silicon devices by combining the gettering action of a $Si_3N_4$ layer and misfit dislocations formed by phosphorus diffusion.

Since the introduction of misfit dislocations leaves a degenerate surface which may act as a source of dopant contamination, it is recommended that a combination of the $Si_3N_4$ and misfit dislocation gettering procedures be used. That is, introduce misfit dislocations to getter the native defect centers, cover the degenerate surface with a $Si_3N_4$ layer which will encapsulate the sample, and provide both a nitride and a misfit defect gettering of process-induced defects. Moreover, where swirl defects are pesent in the wafer, the combined gettering procedures enhances the suppression of SF from devices fabricated from such wafers.

As with Examples I and II, measurements were made on REPROM test chips. Three groups of wafers were used: control wafers with neither a nitride layer nor phosphorus diffusion to form misfit dislocations; wafers with both of the foregoing; and wafers with a nitride layer only. Note that the nitride and/or phosphorus gettering was applied to the entire back side of the wafers of the latter two groups. After processing all wafers simultaneously to form a p-n junction in each chip, leakage currents were measured. These three groups had average leakage current densities of approximately $30 \times 10^{-9}$ amp $cm^{-2}$ (wafers D-1, D-2), $>500 \times 10^{-9}$ amp $cm^{-2}$ (wafer F-8) and $60 \times 10^{-}$ amp $cm^{-2}$ (wafers E-3, E-5), respectively. The junction area was about $5 \times 10^{-4}$ $cm^2$ so that the average leakage currents were, respectively, about $15 \times 10^{-12}$ amps, $250 \times 10^{-12}$ amps and $30 \times 10^{-12}$ amps.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

EXAMPLE IV

This example describes the suppression of SF in silicon wafers by means of an aluminum oxide layer formed on the back surface of a silicon wafer.

The wafers were {100} Si doped n-type with phosphorus and were about 375 $\mu$m thick. On half of the back surface of each of four wafers 2,000 A of aluminum oxide was deposited at 835° C in a reactor by a well known technique, the pyrolysis of aluminum chloride. On one control wafer no aluminum oxide layer was formed. The five wafers were then annealed at 1,050° C for 1 hour before steam oxidizing the front surfaces at 1,050° C for 1 hour to form about 4,000 A of oxide.

Defect counts on the samples were as follows: control wafer — $10^7$ $cm^{-2}$, two wafers had $10^4$ $cm^{-2}$ on the gettered (alumina) half and $10^6$ $cm^{-2}$ on the ungettered half, and the other two wafers had $10^5$ $cm^{-2}$ on the gettered half and $10^6$ $cm^{-2}$ on the ungettered half. Although two orders of magnitude improvement was observed in two wafers, the results were not as good as those obtained using a silicon nitride layer. The latter yielded four orders of magnitude improvement and is therefore preferred.

An aluminum oxide layer can also be used in combination with misfit dislocation gettering in the manner described in Example III.

What is claimed is:

1. In a method of manufacturing semiconductor devices from silicon wafers wherein, before performing any high temperature processing steps which tend to generate stacking faults in the devices, lattice distortion is introduced into the back surface of the wafer and then processing steps are performed directed toward the completion of the device, a process characterized in that
    1. the introduction of lattice distortion includes forming on the back surface a stressed layer, and
    2. the layer is annealed for a time and at a temperature effective to cause stacking fault nucleation sites to diffuse to a region near to the back surface, thereby suppressing the formation of stacking faults in the device.

2. The method of claim 1 wherein said layer is formed so that the stress therein is about $1 \times 10^{10}$ dynes $cm^{-2}$.

3. The process of claim 1 wherein said layer comprises a material selected from the group consisting of silicon nitride and aluminum oxide.

4. The process of claim 3 wherein the layer comprises silicon nitride, has a thickness in the range of about 2,000 to 4,000 A and is annealed for a time in the range of about 1 to 4 hours at a temperature in the range of about 1,000° to 1,200° C.

5. The process of claim 1 wherein the introduction of lattice distortion also includes first forming in the back surface an array of misfit dislocations also effective to getter stacking fault nucleation sites and then forming the stressed layer on the back surface.

6. The process of claim 5 wherein the array of misfit dislocations is formed by diffusion of phosphorus into the back surface.

7. The process of claim 6 wherein the diffusion of phosphorus comprises the steps of forming on the back surface a phosphorus doped oxide layer from $POCl_3$ while heating for a time in the range of about 1 to 7 hours and at a temperature in the range of about 1,050° to 1,150° C, and then removing the phosphorus doped oxide layer before forming the stressed layer on the back surface.

8. The process of claim 1 wherein formation of the stressed layer and the annealing thereof take place before any high temperature oxidation step which tends to introduce stacking faults in the device.

9. The process of claim 1 wherein the stressed layer remains on the back surface of the wafer during the subsequent processing steps directed toward the completion of the device.

10. In a method of manufacturing a semiconductor device from a silicon wafer wherein, before performing any high temperature oxidation step which might tend to generate stacking faults in the device, lattice distortion is introduced in the back surface and then processing steps are performed directed toward the completion of the device including the diffusion of impurities to form at least one p-n junction in the device, a process characterized in that
    1. the introduction of lattice distortion includes (a) forming in the back surface an array of misfit dislocations by the diffusion of phophorus therein and then (b) forming a stressed layer on the back surface;

2. the layer is annealed for a time and at a temperature effective to cause stacking fault nucleation sites to diffuse to a region near to the back surface, thereby suppressing formation of stacking faults in the devices; and 3. the layer remains on the back surface at least during those steps directed toward the completion of the device which tends to generate stacking faults in the device.

11. The method of claim 10 wherein the layer comprises a material selected from the group consisting of silicon nitride and alumnium oxide.

12. In a method of manufacturing semiconductor devices from silicon wafers wherein, before performing any high temperature processing steps which tend to generate stacking faults in the devices, lattice distortion is introduced into the back surface of the wafer and then processing steps are performed directed toward the completion of the device, a process characterized in that the introduction of lattice distortion includes forming in the back surface an array of misfit dislocations by diffusing phosphorus therein, said diffusing step being further characterized in that a phosphorus doped oxide layer is formed on the back surface from $POCl_3$ while heating for a time in the range of about 1 to 7 hours and at a temperature in the range of about 1,050° to 1,150° C.

13. The process of claim 12 wherein before further processing steps are performed the phosphorous doped oxide layer is removed and a layer of material is formed on the back surface effective to prevent outdiffusion of phosphorus from the back surface of the wafer.

\* \* \* \* \*

UNITED STATES PATENT AND TRADEMARK OFFICE
CERTIFICATE OF CORRECTION

PATENT NO. : 3,997,368
DATED : December 14, 1976
INVENTOR(S) : Pierre M. Petroff and George A. Rozgonyi It is certified that error appears in the above–identified patent and that said Letters Patent are hereby corrected as shown below:

Column 5, line 61, change "{111}" to --{100}--.

Column 7, line 13, change "111" to --{111}--.

Column 8, line 16, change "see" to --be--.

Column 9, line 57, change "possible" to --possibly--.

Column 12, line 48, change "interrupted" to --interpreted--.

Column 13, line 31, change "60 X $10^-$" to --60 X $10^{-9}$--.

Signed and Sealed this

Eighth Day of March 1977

[SEAL]

Attest:

RUTH C. MASON
Attesting Officer

C. MARSHALL DANN
Commissioner of Patents and Trademarks